(12) United States Patent
Kim et al.

(10) Patent No.: US 12,166,018 B2
(45) Date of Patent: Dec. 10, 2024

(54) STRETCHABLE DISPLAY DEVICE

(71) Applicant: LG Display Co., Ltd., Seoul (KR)

(72) Inventors: Aesun Kim, Seoul (KR); Hyunju Jung, Seoul (KR)

(73) Assignee: LG Display Co., Ltd., Seoul (KR)

(*) Notice: Subject to any disclaimer, the term of this patent is extended or adjusted under 35 U.S.C. 154(b) by 454 days.

(21) Appl. No.: 17/497,640

(22) Filed: Oct. 8, 2021

(65) Prior Publication Data

US 2022/0122948 A1   Apr. 21, 2022

(30) Foreign Application Priority Data

Oct. 15, 2020   (KR) .......................... 10-2020-0133585

(51) Int. Cl.
*H01L 25/075* (2006.01)
*H01L 23/538* (2006.01)
*H01L 33/62* (2010.01)

(52) U.S. Cl.
CPC ...... *H01L 25/0753* (2013.01); *H01L 23/5387* (2013.01); *H01L 33/62* (2013.01)

(58) Field of Classification Search
CPC . H01L 25/0753; H01L 23/5387; H01L 25/16; G09F 9/301
See application file for complete search history.

(56) References Cited

U.S. PATENT DOCUMENTS

| 6,780,688 | B2 | 8/2004 | Kim |
| 10,326,107 | B2 | 6/2019 | Song et al. |
| 10,573,833 | B2 | 2/2020 | Chen et al. |
| 10,739,889 | B2 | 8/2020 | Hwang et al. |
| 11,018,324 | B2 | 5/2021 | Kim et al. |
| 11,127,809 | B2 * | 9/2021 | Wang ..................... H10K 71/00 |
| 11,271,179 | B2 | 3/2022 | Kim et al. |
| 11,322,565 | B2 | 5/2022 | Jeon et al. |
| 11,328,658 | B2 * | 5/2022 | Wu ......................... G09F 9/301 |
| 11,563,195 | B2 * | 1/2023 | Liu ..................... H10K 50/844 |
| 2003/0227019 | A1 | 12/2003 | Kim |
| 2005/0230684 | A1 | 10/2005 | Seo et al. |
| 2010/0148204 | A1 | 6/2010 | Ikeda et al. |
| 2012/0190220 | A1 | 7/2012 | Lee et al. |

(Continued)

FOREIGN PATENT DOCUMENTS

| CN | 1469424 A | 1/2004 |
| CN | 107706156 A | 2/2018 |

(Continued)

*Primary Examiner* — Mamadou L Diallo
(74) *Attorney, Agent, or Firm* — Seed IP Law Group LLP

(57) ABSTRACT

A stretchable display device includes a lower substrate; a plurality of first substrates which is disposed on the lower substrate and includes a first area in which a plurality of sub pixel including a display element and a driving element is disposed and a second area excluding the first area; a plurality of second substrates configured to couple adjacent first substrates among the plurality of first substrates; and a plurality of connection lines which are disposed on the plurality of second substrates and are configured to couple the plurality of sub pixels, and in the second area, a first contact pad and a second contact pad are disposed and the first contact pad and the second contact pad are coupled to the plurality of connection lines via a plurality of contact holes.

15 Claims, 12 Drawing Sheets

(56) References Cited

U.S. PATENT DOCUMENTS

| | | | | |
|---|---|---|---|---|
| 2014/0104793 | A1* | 4/2014 | Park | H01L 23/5387 |
| | | | | 438/667 |
| 2014/0306941 | A1 | 10/2014 | Kim et al. | |
| 2017/0249886 | A1* | 8/2017 | Choi | H10K 59/90 |
| 2020/0035778 | A1* | 1/2020 | Kim | H10K 59/1275 |
| 2020/0037442 | A1* | 1/2020 | Keum | H10K 59/131 |
| 2020/0111996 | A1* | 4/2020 | Kim | H10K 50/865 |
| 2020/0161276 | A1* | 5/2020 | Kim | H10K 59/131 |
| 2020/0201393 | A1* | 6/2020 | Ahn | G06F 1/1626 |
| 2020/0211437 | A1* | 7/2020 | Ahn | H10K 59/131 |
| 2020/0403039 | A1* | 12/2020 | Park | H10K 50/86 |
| 2021/0376267 | A1* | 12/2021 | Zhang | G06F 1/1626 |
| 2021/0407353 | A1* | 12/2021 | Tian | H10K 59/1216 |
| 2021/0408204 | A1* | 12/2021 | Zhao | H01L 25/167 |
| 2023/0004190 | A1* | 1/2023 | Qian | H04M 1/0269 |

FOREIGN PATENT DOCUMENTS

| | | | | |
|---|---|---|---|---|
| CN | 108122947 | A | 6/2018 | |
| CN | 109725760 | A | 5/2019 | |
| CN | 110739328 | A | 1/2020 | |
| CN | 111009551 | A | 4/2020 | |
| CN | 111199995 | A | 5/2020 | |
| CN | 111384078 | A | 7/2020 | |
| DE | 10 2020 127 507 | A1 | 4/2021 | |
| EP | 3608964 | A1 * | 2/2020 | G09F 9/301 |
| KR | 10-2020-0017336 | A | 2/2020 | |

* cited by examiner

STRETCHABLE DISPLAY DEVICE

CROSS-REFERENCE TO RELATED APPLICATIONS

This application claims the priority of Korean Patent Application No. 10-2020-0133585 filed on Oct. 15, 2020, in the Korean Intellectual Property Office, the disclosure of which is incorporated herein by reference.

BACKGROUND

Technical Field

The present disclosure relates to a stretchable display device, and more particularly to a stretchable display device which improves reliability by suppressing the separation of a connection line.

Description of the Related Art

As display apparatuses which are used for a monitor of a computer, a television, or a cellular phone, there are an organic light emitting display apparatus (OLED) which is a self-light emitting device and a liquid crystal display apparatus (LCD) which requires a separate light source.

An applicable range of the display apparatus is diversified to personal digital assistants as well as monitors of computers and televisions and a display apparatus with a large active area and a reduced volume and weight is being studied.

Further, recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provide a stretchable display device which reduces or minimizes the separation of the connection line when the stretchable display device is stretched.

One or more embodiments of the present disclosure provide a stretchable display device which increases the number of contact pads which is in contact with the connection line and a size of the contact pad to reduce or minimize the separation of the connection line caused by the repeated stretching of the stretchable display device.

One or more embodiments of the present disclosure provide a stretchable display device which electrically connects the connection line to the contact pad via a contact hole to stabilize a voltage to be applied to the connection line.

Technical benefits of the present disclosure are not limited to the above-mentioned benefits, and other benefits, which are not mentioned above, can be clearly understood by those skilled in the art from the following descriptions.

In order to achieve the above-described benefits, according to some embodiments of the present disclosure, a stretchable display device includes a lower substrate; a plurality of first substrates which is disposed on the lower substrate and includes a first area in which a plurality of sub pixel including a display element and a driving element is disposed and a second area excluding the first area; a plurality of second substrates configured to connect adjacent first substrates among the plurality of first substrates; and a plurality of connection lines which are disposed on the plurality of second substrates and are configured to connect the plurality of sub pixels, and in the second area, a first contact pad and a second contact pad are disposed and the first contact pad and the second contact pad are connected to the plurality of connection lines via a plurality of contact holes. By doing this, a structural reliability of the stretchable display device may be improved.

According to another aspect of the present disclosure, a stretchable display device includes a ductile substrate; a plurality of rigid substrates which is disposed on the ductile substrate and includes an emission area in which light is emitted from a display element and a non-emission area in which light is not emitted; a plurality of connection lines disposed between the plurality of rigid substrates; and a plurality of contact pads which is disposed in the non-emission area and is configured to directly contact only with the plurality of connection lines. By doing this, the separation of the plurality of connection lines may be reduced or minimized.

Other detailed matters of the embodiments are included in the detailed description and the drawings.

According to the present disclosure, separation of the connection line caused when the stretchable display device is repeatedly stretched is reduced.

According to the present disclosure, not only the resistance of the connection line of the stretchable display device is reduced, but also the stability of the voltage to be applied to the connection line is achieved.

According to the present disclosure, a structural stretching reliability of the stretchable display device may be improved.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
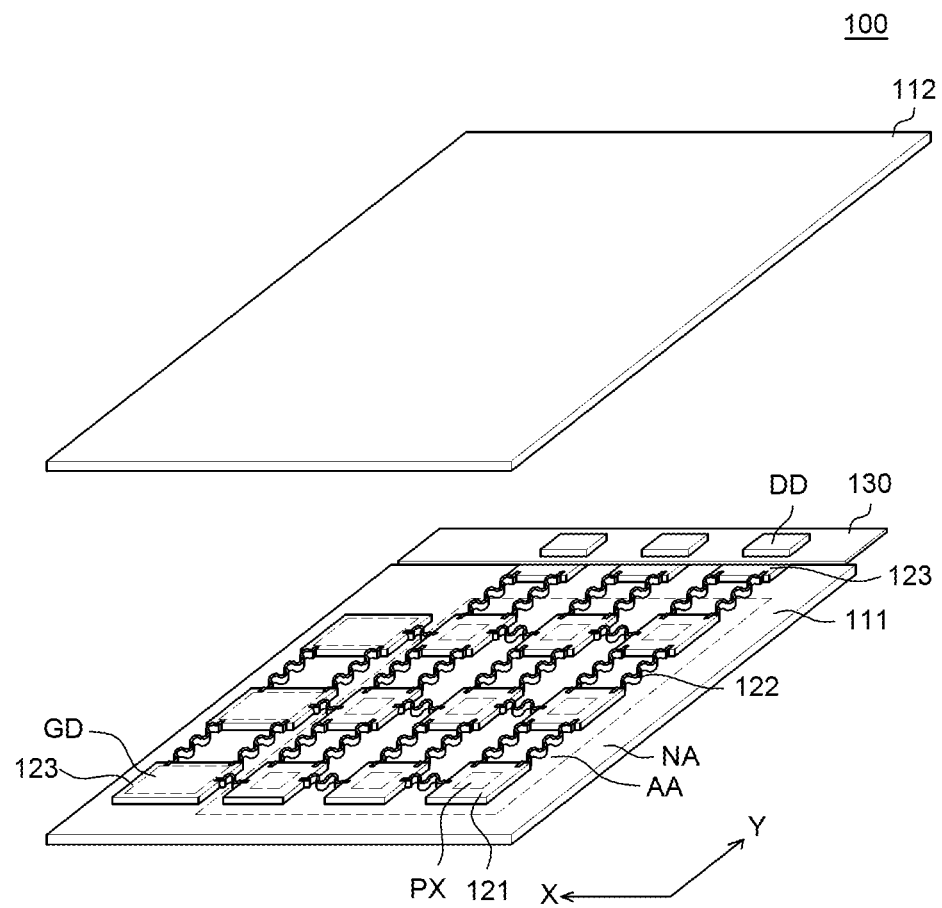
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, the other layer or element may be disposed directly on the another element or layer or may be interposed therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

A low level of a signal may be defined as a first level and a high level of a signal may be defined as a second level.

Hereinafter, a display device according to embodiments of the present disclosure will be described in detail with reference to accompanying drawings.

Stretchable Display Device

A stretchable display device is a display device which is capable of displaying images even in a bent or extended state and is also referred to as a flexible display device and an extendable display device. As compared with the general display devices of the related art, the stretchable display device may have not only a high flexibility, but also stretchability. Therefore, the user may bend or extend a stretchable display device and a shape of a stretchable display device may be freely changed in accordance with manipulation of a user. For example, when the user holds ends of the stretchable display device to pull the stretchable display device, the stretchable display device may be extended to the pulling direction of the user. Alternatively, when the user disposes the stretchable display device on an outer surface which is not flat, the stretchable display device may be disposed to be bent in accordance with the shape of the surface of the wall. Further, when a force applied by the user is removed, the stretchable display device may return to its original shape.

FIG. 1 is an exploded perspective view of a display device according to an embodiment of the present disclosure. Referring to FIG. 1, the stretchable display device 100 includes a lower substrate 111, an upper substrate 112, a plurality of first substrates 121, a plurality of second substrates 122, a plurality of third substrates 123, and a printed circuit board 130. Further, the stretchable display device 100 may include a plurality of pixels PX, gate drivers GD, and data drivers DD.

The lower substrate 111 is a substrate which supports and protects several components of the stretchable display device 100. Further, the upper substrate 112 is a substrate which covers and protects several components of the stretchable display device 100.

The lower substrate 111 and the upper substrate 112 which are ductile substrates may be configured by an insulating material which is bendable or extendable, respectively. For example, the lower substrate 111 and the upper substrate 112 may be formed of a silicon rubber such as polydimethylsiloxane (PDMS) or an elastomer such as polyurethane (PU) or polytetrafluoroethylene (PTFE) and thus have a flexible property. Further, the materials of the lower substrate 111 and the upper substrate 112 may be the same, but are not limited thereto and may vary.

The lower substrate 111 and the upper substrate 112 are ductile substrates so as to be reversibly expandable and contractible. Therefore, the lower substrate 111 may be referred to as a lower ductile substrate or a first ductile substrate and the upper substrate 112 may be referred to as an upper ductile substrate or the second ductile substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to an extension rate at a timing when an object to be extended is broken or cracked. A thickness of the lower substrate may be 10 μm to 1 mm, but is not limited thereto.

The lower substrate 111 may have an active area AA and a non-active area NA enclosing the active area AA.

The active area AA is an area in which images are displayed in the stretchable display device 100. A plurality of pixels PX is disposed in the active area AA. Further, each pixel PX may include a display element and various driving elements for driving the display element. Various driving elements may refer to at least one thin film transistor (TFT) and a capacitor, but are not limited thereto. Further, the plurality of pixels PX may be connected to various wiring lines, respectively. For example, each of the plurality of pixels PX may be connected to various wiring lines, such as a gate line, a data line, a high potential power line, a low potential power line, and a reference voltage line.

The non-active area NA is an area where no image is displayed. The non-active area NA is adjacent to the active area AA to enclose the active area AA. However, it is not limited thereto so that the non-active area NA corresponds to an area excluding the active area AA in the lower substrate 111 and may be modified and separated in various forms. Components for driving the plurality of pixels PX disposed in the active area AA are disposed in the non-active area NA. That is, the gate driver GD may be disposed in the non-active area NA. Further, in the non-active area NA, a plurality of pads connected to the gate driver GD and the data driver DD may be disposed, and each pad may be connected to each of the plurality of pixels PX of the active area AA.

The plurality of first substrates 121, the plurality of second substrates 122, and the plurality of third substrates 123 are disposed on the lower substrate 111.

The plurality of first substrates 121 is disposed in the active area AA of the lower substrate 111 so that the plurality of pixels PX is formed on the plurality of first substrates 121. Further, the plurality of third substrates 123 is disposed in the non-active area NA of the lower substrate 111 so that the gate driver GD and the plurality of pads are formed on the plurality of third substrates 123.

As illustrated in FIG. 1, the gate driver GD may be mounted on a third substrate 123 located at one side of an X-axis direction of the active area AA, among the plurality of third substrates 123. The gate driver GD may be formed on the third substrate 123 in a gate in panel (GIP) manner when various elements on the first substrate 121 are manufactured. Therefore, various circuit configurations which configure the gate driver GD, such as various transistors, capacitors, and wiring lines, may be disposed on the plurality of third substrates 123. However, it is not limited thereto and the gate driver GD may be mounted in a chip on film (COF) manner. Further, the plurality of third substrates 123 may also be disposed in the non-active area NA located at the other side of the X-axis direction of the active area AA and the gate driver GD may also be mounted in the plurality of third substrates 123 located at the other side of the X-axis direction of the active area AA.

Referring to FIG. 1, sizes of the plurality of third substrates 123 may be larger than sizes of the plurality of first substrates 121. Specifically, a size of each of the plurality of third substrates 123 may be larger than a size of each of the plurality of first substrates 121. As described above, on each of the plurality of third substrates 123, the gate driver GD is disposed. For example, one stage of the gate driver GD may be disposed on each of the plurality of third substrates 123. Therefore, an area occupied by various circuit configurations which configure one stage of the gate driver GD may be relatively larger than an area of the first substrate 121 in which the pixel PX is disposed. As a result, a size of each of the plurality of third substrates 123 may be larger than a size of each of the plurality of first substrates 121.

Even though in FIG. 1, it is illustrated that the plurality of third substrates 123 is disposed at one side of a Y-axis direction and one side of the X-axis direction in the non-active area NA, it is not limited thereto and may be disposed in an arbitrary area of the non-active area NA. Further, even though it is illustrated that the plurality of first substrates 121 and the plurality of third substrates 123 have a quadrangular shape, it is not limited thereto and the plurality of first substrates 121 and the plurality of third substrates 123 may vary in various forms.

The plurality of second substrates 122 is substrates which connect adjacent first substrates 121, adjacent third substrates 123, or the first substrate 121 and the third substrate 123 which are adjacent and may be referred to as connection substrates. That is, the plurality of second substrates 122 is disposed between the plurality of first substrates 121, between the plurality of third substrates 123, or between the plurality of first substrates 121 and the plurality of third substrates 123.

Referring to FIG. 1, the plurality of second substrates 122 has a wavy shape. For example, the plurality of second substrates 122 may have a sinusoidal shape. However, the shape of the plurality of second substrates 122 is not limited thereto and for example, the plurality of second substrates 122 may extend in a zigzag pattern or may be formed with various shapes such as a shape extended by connecting a plurality of rhombus-shaped substrates at vertexes. Further, the number and the shape of the plurality of second substrates 122 illustrated in FIG. 1 are illustrative and the number and the shape of the plurality of second substrates 122 may vary depending on the design.

Further, the plurality of first substrates 121, the plurality of second substrates 122, and the plurality of third substrates 123 are rigid substrates. That is, the plurality of first substrates 121, the plurality of second substrates 122, and the plurality of third substrates 123 are rigider than the lower substrate 111. The moduli of elasticity of the plurality of first substrates 121, the plurality of second substrates 122, and the plurality of third substrates 123 may be higher than a modulus of elasticity of the lower substrate 111. The modulus of elasticity is a parameter representing a rate of deformation against the stress applied to the substrate and the higher the modulus of elasticity, the higher the hardness. Therefore, the first substrate 121, the second substrate 122, and the third substrate 123 may be referred to as a first rigid substrate, a second rigid substrate, and a third rigid substrate, respectively. The moduli of elasticity of the plurality of first substrates 121, the plurality of second substrates 122, and the plurality of third substrates 123 may be 1000 times higher than the modulus of elasticity of the lower substrate 111, but are not limited thereto.

The plurality of first substrates 121, the plurality of second substrates 122, and the plurality of third substrates 123 which are a plurality of rigid substrates may be formed of a plastic material having a flexibility lower than that of the lower substrate 111 and for example, may be formed of polyimide (PI), polyacrylate, polyacetate, or the like. In this case, the plurality of first substrates 121 and the plurality of third substrates 123 may be formed of the same material, but are not limited thereto and may be formed of different materials.

In some embodiments, the lower substrate 111 may be defined to include a plurality of first lower patterns and a second lower pattern. The plurality of first lower patterns is disposed in an area of the lower substrate 111 overlapping the plurality of first substrates 121 and the plurality of third substrates 123. The second lower pattern may be disposed in an area excluding an area where the plurality of first substrates 121 and the plurality of third substrates 123 are disposed or may be disposed in the entire stretchable display device 100.

In this case, moduli of elasticity of the plurality of first lower patterns may be higher than modulus of elasticity of the second lower pattern. For example, the plurality of first lower patterns may be formed of the same material as the plurality of first substrates 121 and the plurality of third substrates 123 and the second lower pattern may be formed of a material having a modulus of elasticity lower than those of the plurality of first substrates 121 and the plurality of third substrates 123.

That is, the first lower pattern may be formed of polyimide (PI), polyacrylate, polyacetate, or the like and the second lower pattern may be formed of silicon rubber such as polydimethylsiloxane (PDMS) or elastomer such as polyurethane (PU) or polytetrafluoroethylene (PTFE).

The gate driver GD is a component which supplies a gate voltage to the plurality of pixels PX disposed in the active area AA. The gate driver GD includes a plurality of stages formed on the plurality of third substrates 123 and each stage of the gate driver GD may be electrically connected to each other. Accordingly, a gate voltage output from any one of stages may be transmitted to the other stage. Further, each stage may sequentially supply the gate voltage to the plurality of pixels PX connected to each stage.

A power supply is connected to the gate driver GD to supply a gate driving voltage and a gate clock voltage. Further, the power supply is connected to the plurality of pixels PX to supply a pixel driving voltage to each of the plurality of pixels PX. The power supply may also be formed on the plurality of third substrates 123. That is, the power supply may be formed on an outer peripheral substrate 121 to be adjacent to the gate driver GD. Further, each of the power supplies formed on the plurality of third substrates 123 may be electrically connected to each other. That is, the plurality of power supplies formed on the plurality of third substrates 123 may be connected by a gate power supply connection line and a pixel power supply connection line. Therefore, each of the plurality of power supply may supply a gate driving voltage, a gate clock voltage, and a pixel driving voltage.

The printed circuit board 130 is a component which transmits signals and voltages for driving the display element from the control unit to the display element. Therefore, the printed circuit board 130 may also be referred to as a driving substrate. A control unit such as an IC chip or a circuit unit may be mounted on the printed circuit board 130. Further, on the printed circuit board 130, a memory, a processor, or the like may be mounted. Further, the printed circuit board 130 provided in the stretchable display device 100 may include a stretching area and a non-stretching area to ensure stretchability. Further, in the non-stretching area, an IC chip, a circuit unit, a memory, a processor, and the like are mounted and in the stretching area, wiring lines which are electrically connected to the IC chip, the circuit unit, the memory, and the processor may be disposed. Further, the printed circuit board 130 may be bonded to the plurality of pads of the plurality of third substrates 123 disposed in the non-active area NA.

The data driver DD is a component which supplies a data voltage to the plurality of pixels PX disposed in the active area AA. The data driver DD may be configured as an IC chip so that it may be also referred to as a data integrated circuit D-IC. Further, the data driver DD may be mounted in the non-stretching area of the printed circuit board 130. That is, the data driver DD may be mounted on the printed circuit board 130 in the form of a chip on board (COB). Further, the data driver DD supplies data voltages to the plurality of pixels PX disposed in the active area AA via the plurality of pads disposed on the plurality of third substrates 123. However, even though in FIG. 1, it is illustrated that the data driver DD is mounted in a chip on board (COB) manner, it is not limited thereto and the data driver DD may be mounted by a chip on film (COF), a chip on glass (COG), a tape carrier package (TCP) manner, or the like.

Further, in FIG. 1, it is illustrated that one third substrate 123 is disposed in the non-active area NA above the active area AA so as to correspond to one row of first substrates 121 disposed in the active area AA and one data driver DD is disposed for one third substrate 123, but is not limited thereto. That is, one third substrate 123 and one data driver DD may be disposed so as to correspond to a plurality of rows of the first substrates 121.

Hereinafter, the active area AA of the stretchable display device 100 according to an embodiment of the present disclosure will be described in more detail with reference to FIGS. 2, 3A, and 3B.

Planar and Cross-Sectional Structures of Active Area

Figure 2:
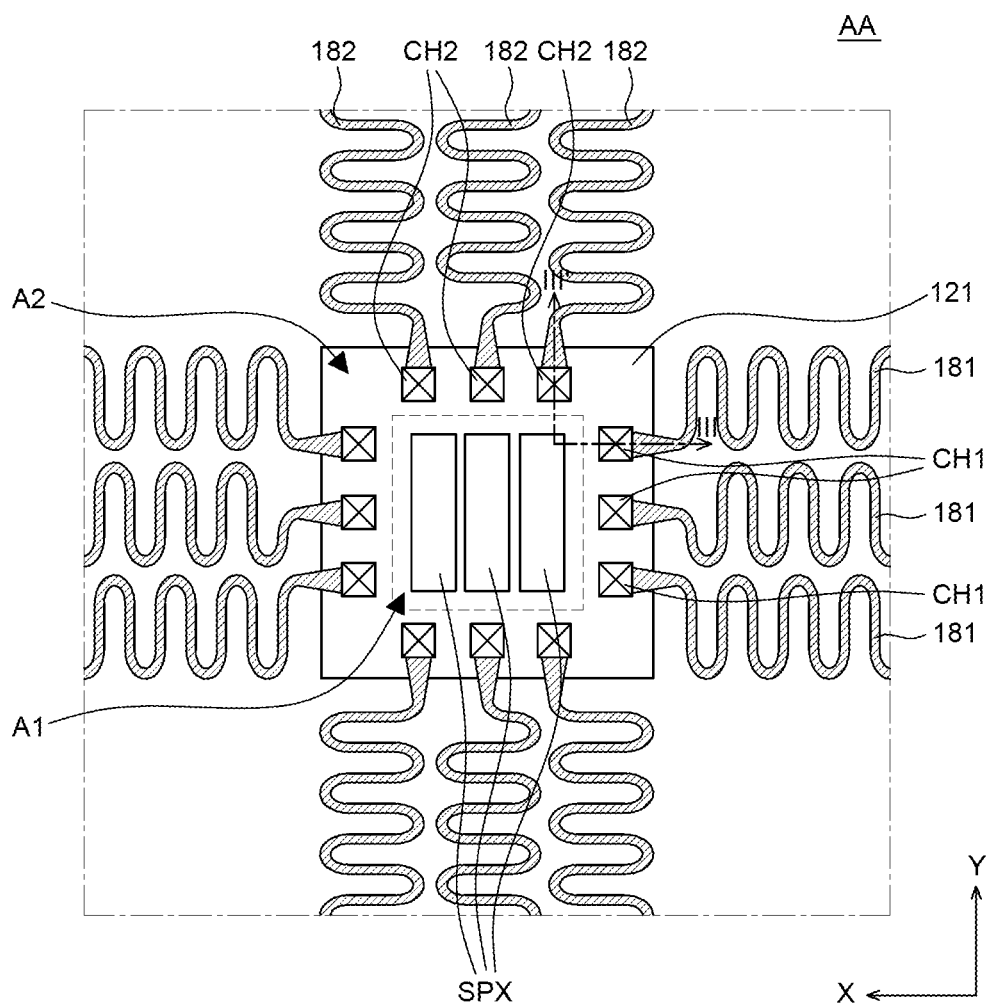
FIG. 2 is an enlarged plan view of an active area of a stretchable display device according to an embodiment of the present disclosure.

FIG. 2 is an enlarged plan view of an active area of a stretchable display device according to an embodiment of the present disclosure. FIGS. 3A and 3B are schematic cross-sectional views taken along of FIG. 2. For the convenience of description, the description will be made also with reference to FIG. 1.

Referring to FIGS. 1 and 2, the plurality of first substrates 121 is disposed on the lower substrate 111 in the active area AA. The plurality of first substrates 121 is spaced apart from each other to be disposed on the lower substrate 111. For example, as illustrated in FIG. 1, the plurality of first substrates 121 may be disposed on the lower substrate 111 in a matrix, but is not limited thereto.

The plurality of first substrates 121 may be divided in a first area A1 serving as an emission area in which light is emitted and a second area A2 serving as a non-emission area in which light is not emitted. That is, the first area A1 refers to an area where a plurality of sub pixels SPX which configures the plurality of pixels PX is disposed and the second area A2 refers to a partial area of the plurality of first substrates 121 excluding the first area A1.

Figure 3A:
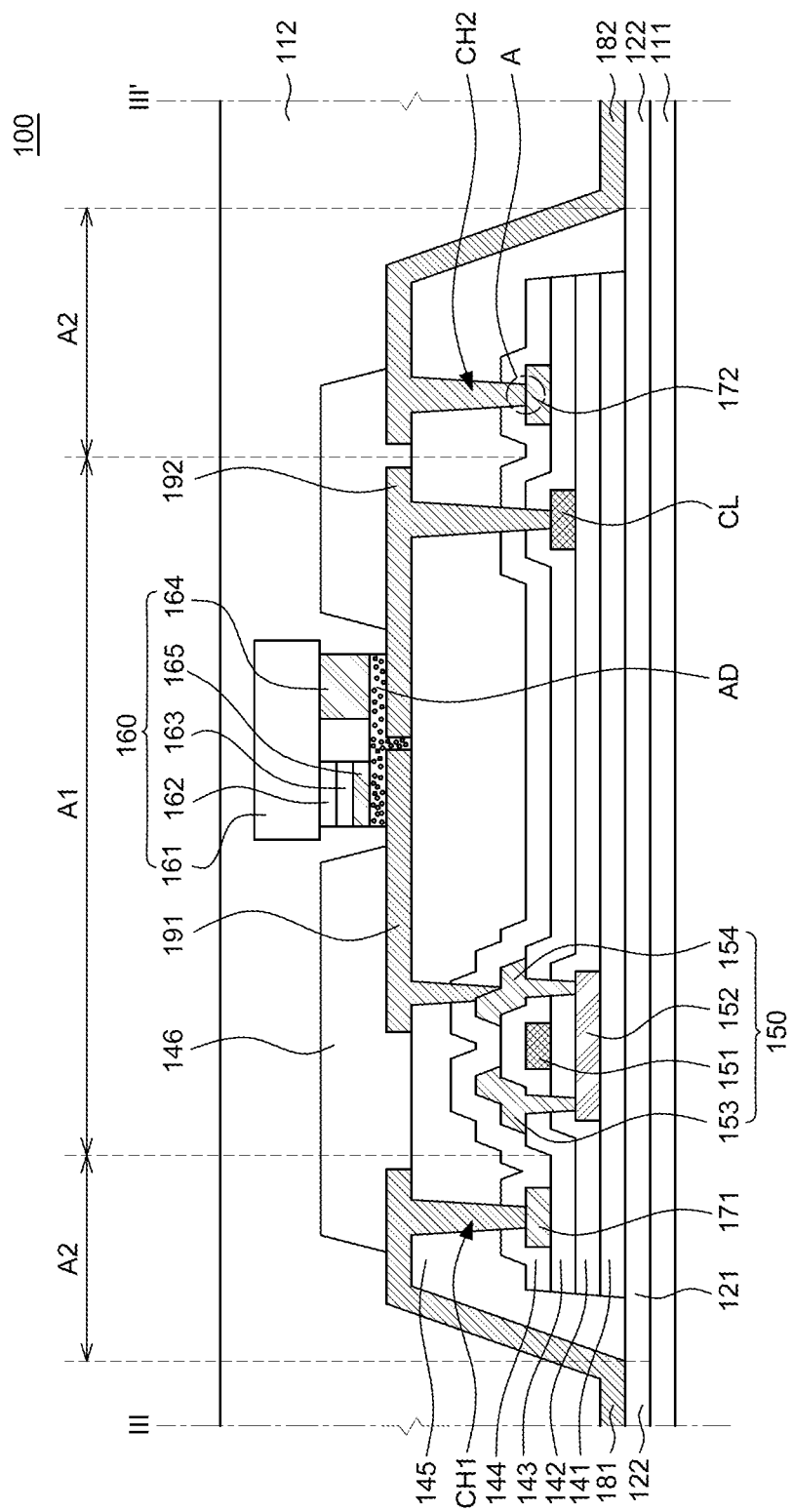
FIGS. 3A and 3B are schematic cross-sectional views taken along of FIG. 2.
Figure 3B:
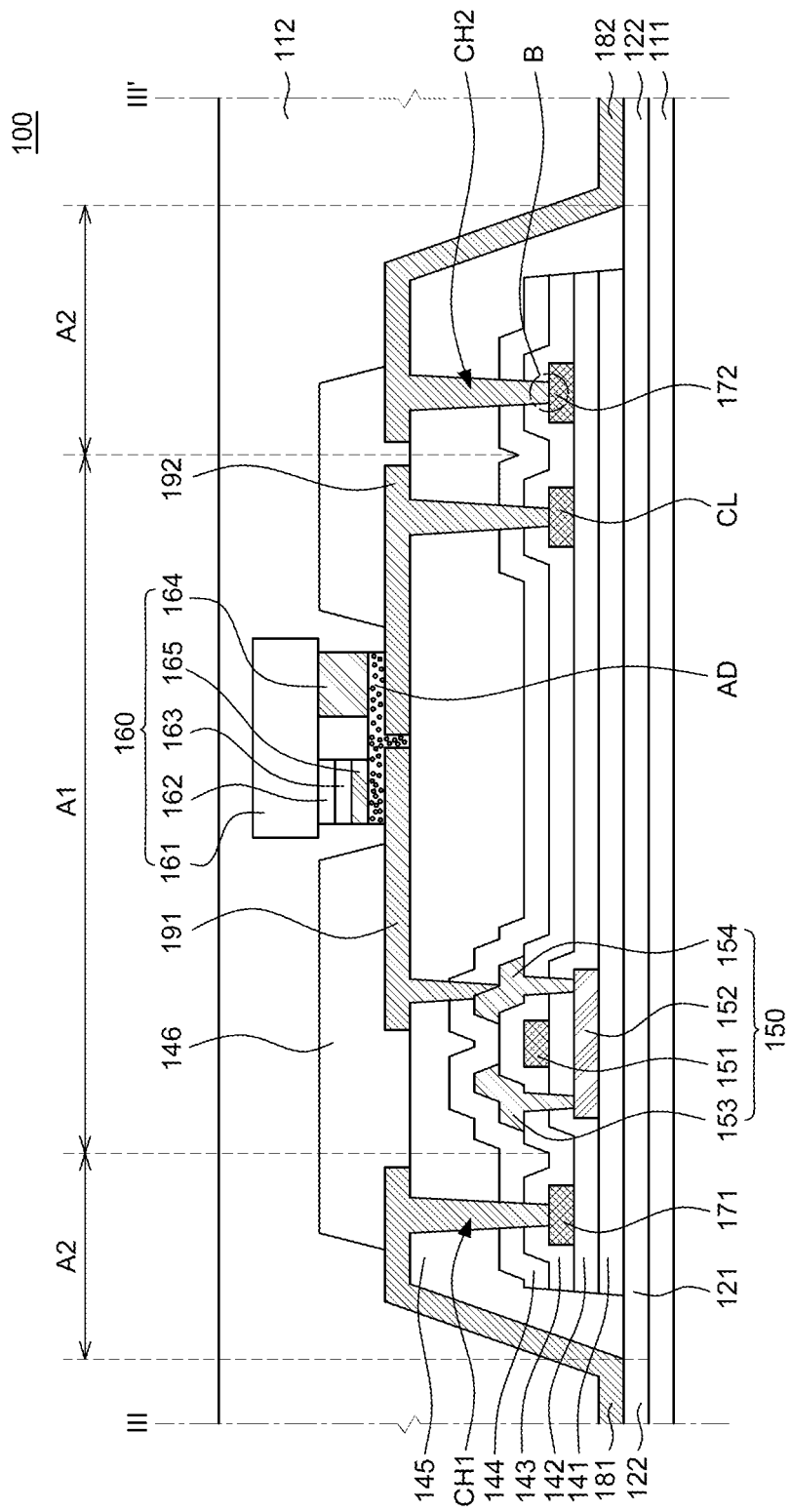

Referring to FIGS. 2, 3A, and 3B, a pixel PX including the plurality of sub pixels SPX is disposed in the first area A1. Further, each sub pixel SPX may include an LED 160 which is a display element and a transistor 150 which drives the LED 160. However, in the sub pixel SPX, the display element is not limited to the LED, but may be changed to an organic light emitting diode and the sub pixel SPX may further include a driving element such as a capacitor. Further, the plurality of sub pixels SPX may include a red sub pixel, a green sub pixel, and a blue sub pixel, but is not limited thereto and colors of the plurality of sub pixels SPX may be modified to various colors as needed.

In some embodiments, the connection line 180 includes a first connection line 181 and a second connection line 182. In some embodiments, the contact hole CH includes a first contact hole CH1 and a second contact hole CH2. In some embodiments, the contact pad 170 includes a first contact pad 171 and a second contact pad 172. In the second area A2, at least one contact pad 170 is disposed and each of at least one contact pad 170 may be connected to the connection line 180 via at least one contact hole CH. That is, in the second area A2, the first contact pad 171 is in physically contact with the first connection line 181 via a first contact hole CH1 to be electrically connected and the second contact pad 172 is in physically contact with the second connection line 182 via a second contact hole CH2 to be electrically connected.

Further, as illustrated in FIG. 2, on an X-Y plane, each of at least one contact hole CH may have a point shape or a polygonal shape and each of at least one contact pad 170 may have a point shape or a polygonal shape depending on a shape of the contact hole CH. The above-described shape of the contact hole CH may be described that a length of the cross-section in an X-axis direction and a length of the cross-section in a Y-axis direction are equal to each other on the X-Y plane.

Hereinafter, referring to FIGS. 3A and 3B, a cross-sectional structure of the active area will be described in detail.

Referring to FIGS. 3A and 3B, a plurality of inorganic insulating layers is disposed on the plurality of first substrates 121. For example, the plurality of inorganic insulating layers may include a buffer layer 141, a gate insulating layer 142, an interlayer insulating layer 143, and a passivation layer 144, but is not limited thereto. Therefore, various inorganic insulating layers may be additionally disposed on the plurality of first substrates 121 or one or more of the buffer layer 141, the gate insulating layer 142, the interlayer insulating layer 143, and the passivation layer 144 may be omitted in the inorganic insulating layers.

Specifically, the buffer layer 141 is disposed on the plurality of first substrates 121. The buffer layer 141 is formed on the plurality of first substrates 121 to protect various components of the stretchable display device 100 from permeation of moisture ($H_2O$) and oxygen ($O_2$) from the outside of the lower substrate 111 and the plurality of first substrates 121. The buffer layer 141 may be configured by an insulating material and for example, configured by a single layer or a double layer of an inorganic layer formed of silicon nitride (SiNx), silicon oxide (SiOx), and silicon oxynitride (SiON). However, the buffer layer 141 may be omitted depending on a structure or a characteristic of the stretchable display device 100.

In this case, the buffer layer 141 may be formed only in an area overlapping the plurality of first substrates 121 and the plurality of third substrates 123. As described above, the buffer layer 141 may be formed of an inorganic material so that the buffer layer 141 may be easily cracked to be damaged during a process of stretching the stretchable display device 100. Therefore, the buffer layer 141 is not formed in an area between the plurality of first substrates 121 and the plurality of third substrates 123. Instead, the buffer layer 141 is patterned to have a shape of the plurality of first substrates 121 and the plurality of third substrates 123 to be disposed only above the plurality of first substrates 121 and the plurality of third substrates 123. Therefore, in the stretchable display device 100 according to the embodiment of the present disclosure, the buffer layer 141 is formed only in an area overlapping the plurality of first substrates 121 and the plurality of third substrates 123 which are rigid substrates. Therefore, even though the stretchable display device 100 is bent or stretched to be deformed, the damage of the buffer layer 141 may be suppressed.

Referring to FIGS. 3A and 3B, the transistor 150 including a gate electrode 151, an active layer 152, a source electrode 153, and a drain electrode 154 is formed on the buffer layer 141 in the first area A1.

First, referring to FIGS. 3A and 3B, the active layer 152 is disposed on the buffer layer 141. For example, the active layer 152 may be formed of an oxide semiconductor, amorphous silicon (a-Si), polycrystalline silicon (poly-Si), an organic semiconductor, or the like.

The gate insulating layer 142 is disposed on the active layer 152. The gate insulating layer 142 is a layer for electrically insulating the gate electrode 151 from the active layer 152 and may be formed of an insulating material. For example, the gate insulating layer 142 may be formed as a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 is disposed on the buffer layer 141. The gate electrode 151 is disposed to overlap the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The interlayer insulating layer 143 is disposed on the gate electrode 151. The interlayer insulating layer 143 is a layer which insulates the gate electrode 151 from the source electrode 153 and the drain electrode 154 and is formed of an inorganic material, similarly to the buffer layer 141. For example, the interlayer insulating layer 143 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152 are disposed on the interlayer insulating layer 143. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

In FIGS. 3A and 3B, even though among various transistors which may be included in the stretchable display device 100, only a driving transistor is illustrated for the convenience of description, a switching transistor, a capacitor, or the like may also be included in the display device. Further, in this specification, even though it is described that the transistor 150 has a coplanar structure, various transistors such as a staggered structure may also be used.

Referring to FIGS. 3A and 3B, a plurality of contact pads 170 is disposed in the second area A2. The plurality of contact pads 170 disposed in the second area A2 may include a first contact pad 171 formed in the Y-axis direction and a second contact pad 172 formed in an X-axis direction. As described above, when the plurality of contact pads 170 has a point shape or a polygonal shape, the first contact pad 171 is disposed in the Y-axis direction and the second contact pad 172 may be disposed in an X-axis direction.

Further, as illustrated in FIG. 3A, the plurality of contact pads 170 may be formed of the same material as the source electrode 153 and the drain electrode 154. Alternatively, as illustrated in FIG. 3B, the plurality of contact pads 170 may be formed of the same material as the gate electrode 151. However, the plurality of contact pads 170 is not limited to the materials of the components of the transistor 150, but may be configured by various metals.

Further, in the second area A2, a gate pad and a data pad may be disposed on the interlayer insulating layer 143. The gate pad is a pad which transmits a gate voltage to the plurality of sub pixels SPX. The gate voltage may be transmitted to the gate electrode 151 from the gate pad through a gate line formed on the first substrate 121. The data pad is a pad which transmits a data voltage to the plurality of sub pixels SPX. The data voltage may be transmitted to the source electrode 153 or the drain electrode 154 from the data pad through a data line formed on the first substrate 121. The gate pad and the data pad may be formed of the same material as the source electrode 153 and the drain electrode 154, but is not limited thereto.

Referring to FIGS. 3A and 3B, the passivation layer 144 is formed on the transistor 150 and the plurality of contact pads 170. That is, the passivation layer 144 covers the transistor 150 to protect the transistor 150 from the permeation of moisture and oxygen. The passivation layer 144 may be formed of an inorganic material and configured by a single layer or a plurality of layers, but is not limited thereto.

Further, the gate insulating layer 142, the interlayer insulating layer 143, and the passivation layer 144 are patterned to be formed only in an area overlapping the plurality of first substrates 121. The gate insulating layer 142, the interlayer insulating layer 143, and the passivation layer 144 are also formed of the inorganic material, similarly to the buffer layer 141. Therefore, the gate insulating layer 142, the interlayer insulating layer 143, and the passivation layer 144 may also be easily cracked to be damaged during the process of extending the stretchable display device 100. Therefore, the gate insulating layer 142, the interlayer insulating layer 143, and the passivation layer 144 are not formed in an area between the plurality of first substrates 121, but are patterned to have a shape of the plurality of first substrates 121 to be formed only above the plurality of first substrates 121.

The planarization layer 145 is formed on the passivation layer 144. The planarization layer 145 planarizes an upper portion of the transistor 150. The planarization layer 145 may be configured by a single layer or a plurality of layers and may be formed of an organic material. Therefore, the planarization layer 145 may also be referred to as an organic insulating layer. For example, the planarization layer 145 may be formed of an acrylic-based organic material, but is not limited thereto.

Referring to FIGS. 3A and 3B, the planarization layer 145 is disposed on the plurality of first substrates 121 to cover top surfaces and side surfaces of the buffer layer 141, the gate insulating layer 142, the interlayer insulating layer 143, and the passivation layer 144. The planarization layer 145 may be disposed to enclose the buffer layer 141, the gate insulating layer 142, the interlayer insulating layer 143, and the passivation layer 144 together with the plurality of first substrates 121. Specifically, the planarization layer 145 may be disposed so as to cover a top surface and a side surface of the passivation layer 144, a side surface of the interlayer insulating layer 143, a side surface of the gate insulating layer 142, a side surface of the buffer layer 141, and a part of a top surface of the plurality of first substrates 121. Therefore, the planarization layer 145 may compensate for a step on the side surfaces of the buffer layer 141, the gate insulating layer 142, the interlayer insulating layer 143, and the passivation layer 144 and enhance an adhesive strength of the planarization layer 145 and the connection line 180 disposed on the side surface of the planarization layer 145.

Referring to FIGS. 3A and 3B, an inclination angle of the side surface of the planarization layer 145 may be smaller than an inclination angle formed by side surfaces of the buffer layer 141, the gate insulating layer 142, the interlayer insulating layer 143, and the passivation layer 144. For example, the side surface of the planarization layer 145 may have a slope which is gentler than a slope formed by the side surface of the passivation layer 144, the side surface of the interlayer insulating layer 143, the side surface of the gate insulating layer 142, and the side surface of the buffer layer 141. Therefore, the connection line 180 which is disposed to be in contact with the side surface of the planarization layer 145 is disposed with a gentle slope so that when the stretchable display device 100 is extended, a stress generated in the connection line 180 is reduced. Further, the crack caused in the connection line 180 or a separation from the side surface of the planarization layer 145 may be suppressed.

Referring to FIGS. 3A and 3B, a common line CL is disposed on the gate insulating layer 142. The common line CL is a wiring line which applies a common voltage to the plurality of sub pixels SPX. The common line CL may be formed of the same material as the gate electrode 151 of the transistor 150, but is not limited thereto.

Referring to FIGS. 2, 3A, and 3B, the connection line 180 refers to a wiring line which electrically connects the pads on the plurality of first substrates 121. The connection line 180 is disposed on the plurality of second substrates 122. Further, the connection line 180 may also be partially formed on the plurality of first substrates 121 to be electrically connected to the pad on the plurality of first substrates 121. The pads on the first substrate 121 refer to a plurality of contact pads 170, a gate pad, and a data pad.

The connection lines 180 include a first connection line 181 and a second connection line 182. The first connection line 181 and the second connection line 182 are disposed between the plurality of first substrates 121. Specifically, the first connection line 181 refers to a wiring line extending in the X-axis direction between the plurality of first substrates 121, among the connection lines 180. The second connection line 182 refers to a wiring line extending in the Y-axis direction between the plurality of first substrates 121, among the connection lines 180.

The connection line 180 may be formed of a metal material, such as copper (Cu), aluminum (Al), titanium (Ti), and molybdenum or a stacked structure of metal materials, such as copper/molybdenum-titanium (Cu/Moti) or titanium/aluminum/titanium (Ti/Al/Ti), but is not limited thereto.

In the case of a general display device, various wiring lines such as a plurality of gate lines and a plurality of data lines extend between the plurality of sub pixels in a straight line shape and the plurality of sub pixels is connected to one signal line. Therefore, in the general display device, various wiring lines, such as a gate line, a data line, a high potential power line, and a reference voltage line, extend from one side to the other side of the organic light emitting display device without being disconnected on the substrate.

In contrast, in the stretchable display device 100 according to the embodiment of the present disclosure, various wiring lines, such as a gate line, a data line, a high potential power line, or a reference voltage line having a straight line shape which are considered to be used for the general organic light emitting display device, may be disposed only on the plurality of first substrates 121 and the plurality of third substrates 123. That is, in the stretchable display device 100 according to the embodiment of the present disclosure, a straight wiring line is disposed only on the plurality of first substrates 121 and the plurality of third substrates 123.

In the stretchable display device 100 according to the embodiment of the present disclosure, in order to connect discontinuous wiring lines on the first substrate 121 or the third substrate 123, pads on two adjacent first substrates 121 or two adjacent third substrates 123 may be connected by the connection line 180. That is, the connection line 180 electrically connects pads on two first substrates 121, on two third substrates 123, and on the first substrate 121 and the third substrate 123, which are adjacent to each other. Accordingly, the stretchable display device 100 according to the embodiment of the present disclosure may include a plurality of connection lines 180 which electrically connects various wiring lines, such as a gate line, a data line, a high potential power line, and a reference voltage line, between the plurality of first substrates 121, between the plurality of third substrates 123, and between the plurality of first substrates 121 and the plurality of third substrates 123. For example, the gate line may be disposed on the plurality of first substrates 121 disposed to be adjacent to each other in the X-axis direction and the gate pad may be disposed on both ends of the gate line. In this case, the plurality of gate pads on the plurality of first substrates 121 adjacent to each other in the X-axis direction may be connected to each other by the first connection line 181 which serves as a gate line. Therefore, the gate line disposed on the plurality of first substrates 121 and the first connection line 181 disposed on the third substrate 123 may serve as one gate line. Further, wiring lines which extend in the X-axis direction, among all various wiring lines which may be included in the stretchable display device 100, such as an emission signal line, a low potential power line, and a high potential power line, may also be electrically connected by the first connection line 181, as described above.

Referring to FIGS. 2, 3A and 3B, the first connection line 181 may connect pads on two first substrates 121 which are disposed side by side among the pads on the plurality of first substrates 121 which is disposed to be adjacent to each other in the X-axis direction. The first connection line 181 may serve as a gate line, an emission signal line, a high potential power line, or a low potential power line, but is not limited thereto. For example, the first connection line 181 may serve as a gate line and electrically connect the gate pads on two first substrates 121 which are disposed side by side in the X-axis direction. Therefore, as described above, the gate pads on the plurality of first substrates 121 disposed in the X-axis direction may be connected by the first connection line 181 serving as a gate line and transmit one gate voltage.

Further, the second connection line 182 may connect pads on two first substrates 121 which are disposed side by side among the pads on the plurality of first substrates 121 which is disposed to be adjacent to each other in the Y-axis direction. The second connection line 182 may serve as a data line, a high potential power line, a low potential power line, or a reference voltage line, but is not limited thereto. For example, the second connection line 182 may serve as a data line and electrically connect the data lines on two first substrates 121 which are disposed side by side in the Y-axis direction. Therefore, as described above, the pads on the plurality of first substrates 121 disposed in the Y-axis direction may be connected by the plurality of second connection line 182 serving as a data line and transmit one data voltage.

Referring to FIG. 1, the connection line 180 may further include a third connection line configured to connect pads on the plurality of first substrates 121 and the plurality of third substrates 123 or connects pads on two third substrates 123 disposed side by side, among pads on the plurality of third substrates 123 disposed to be adjacent to each other in the Y-axis direction. This will be described below with reference to FIG. 4.

As illustrated in FIGS. 3A and 3B, the first connection line 181 may be formed to extend to a top surface of the second substrate 122 while being in contact with a top surface and a side surface of the planarization layer 145 disposed on the first substrate 121. Further, the second connection line 182 may be formed to extend to a top surface of the second substrate 122 while being in contact with a top surface and a side surface of the planarization layer 145 disposed on the first substrate 121.

Referring to FIGS. 3A and 3B, a bank 146 is formed on the first connection pad 191, the second connection pad 192, the connection line 180, and the planarization layer 145. The bank 146 is a component which divides adjacent sub pixels SPX.

The bank 146 is disposed so as to cover a part of the second connection line 182 and the first connection pad 191 which are adjacent to each other or at least a part of the first connection line 181 and the second connection pad 192. The bank 146 may be formed of an insulating material. Further, the bank 146 may include a black material. The bank 146 includes the black material to block wiring lines which may be visible through the active area AA. For example, the bank 146 may be formed of a transparent carbon-based mixture and specifically, include carbon black. However, it is not limited thereto and the bank 146 may be formed of a transparent insulating material.

Referring to FIGS. 3A and 3B, an LED 160 is disposed on the first connection pad 191 and the second connection pad 192. The LED 160 includes an n-type layer 161, an active layer 162, a p-type layer 163, an n-electrode 164, and a p-electrode 165. The LED 160 of the display device 100 according to the embodiment of the present disclosure has a flip-chip structure in which the n-electrode 164 and the p-electrode 165 are formed on one surface.

The n-type layer 161 may be formed by injecting an n-type impurity into gallium nitride (GaN) having excellent crystallinity. The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure may be manufactured by sequentially laminating the n-type layer 161, the active layer 162, and the p-type layer 163, and then etching a predetermined part to form the n-electrode 164 and the p-electrode 165. In this case, the predetermined part which is a space for separating the n-electrode 164 and the p-electrode 165 from each other may be etched to expose a part of the n-type layer 161. In other words, the surfaces of the LED 160 on which the n-electrode 164 and the p-electrode 165 are disposed are not flat surfaces, but have different height levels.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 may be also formed of a conductive material, and for example, may be formed of the same material as the n-electrode 164.

An adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulation property. For example, the n-electrode 164 is electrically connected to the second connection line 182 via the adhesive layer AD and the p-electrode 165 is electrically connected to the first connection line 181 via the adhesive layer AD. That is, after applying the adhesive layer AD on the first connection pad 191 and the second connection pad 192 using an inkjet method, the LED 160 is transferred onto the adhesive layer AD and the LED 160 is pressurized and heated. By doing this, the first connection pad 191 is electrically connected to the p-electrode 165 and the second connection pad 192 is electrically connected to the n-electrode 164. However, the remaining part of the adhesive layer AD excluding a part of the adhesive layer AD disposed between the n-electrode 164 and the second connection pad 192 and a part of the adhesive layer AD disposed between the p-electrode 165 and the first connection pad 191 has an insulating property. In the meantime, the adhesive layer AD may be divided to be disposed on the first connection pad 191 and the second connection pad 192, respectively.

As described above, the display device 100 according to the embodiment of the present disclosure has a structure in which the LED 160 is disposed on the lower substrate 111 on which the transistor 150 is disposed. Therefore, when the display device 100 is turned on, different voltage levels which are applied to the first connection pad 191 and the second connection pad 192 are transmitted to the n-electrode 164 and the p-electrode 165 so that the LED 160 emits light.

Referring to FIGS. 3A and 3B, the upper substrate 112 is disposed on the bank 146, the LED 160, and the lower substrate 111.

The upper substrate 112 is a substrate which supports various components disposed below the upper substrate 112. Specifically, the upper substrate 112 is formed by coating a material which configures the upper substrate 112 on the lower substrate 111 and the first substrate 121 and then hardening the material to be in contact with the lower substrate 111, the first substrate 121, the second substrate 122, and the connection line 180.

The upper substrate 112 may be formed of the same material as the lower substrate 111. For example, the upper substrate 112 may be formed of a silicon rubber such as polydimethylsiloxane (PDMS) or an elastomer such as polyurethane (PU) or polytetrafluoroethylene (PTFE) and thus have a flexible property. However, the material of the upper substrate 112 is not limited thereto.

In the meantime, even though not illustrated in FIG. 3, a polarization layer may be disposed on the upper substrate 112. The polarization layer may perform a function which polarizes light incident from the outside of the stretchable display device 100 to reduce the external light reflection. Further, an optical film other than the polarization layer may be disposed on the upper substrate 112.

Hereinafter, the non-active area NA of the stretchable display device 100 according to an embodiment of the present disclosure will be described in more detail with reference to FIGS. 4, 5A, and 5B.

Planar and Cross-Sectional Structures of Non-Active Area

Figure 4:
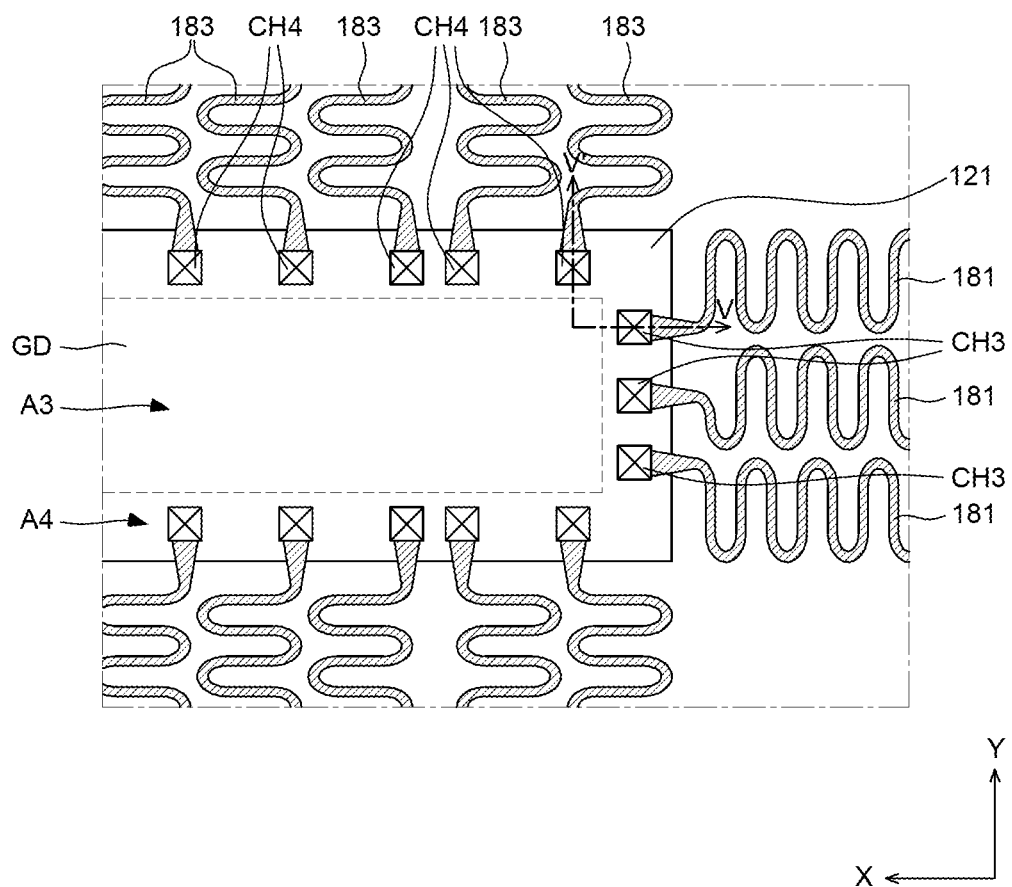
FIG. 4 is an enlarged plan view of a non-active area of a stretchable display device according to an embodiment of the present disclosure.

FIG. 4 is an enlarged plan view of a non-active area of a stretchable display device according to an embodiment of the present disclosure. FIGS. 5A and 5B are schematic cross-sectional views taken along V-V' of FIG. 4. For the convenience of description, the description will be made also with reference to FIG. 1.

Referring to FIGS. 1 and 4, the plurality of third substrates 123 is disposed on the lower substrate 111 in the non-active area NA. The plurality of third substrates 123 is spaced apart from each other to be disposed on the lower substrate 111. For example, as illustrated in FIG. 1, the plurality of third substrates 123 may be disposed on the lower substrate 111 in one line, but is not limited thereto.

The plurality of first substrates 121 may be divided in a third area A3 in which the gate driver GD is disposed and a fourth area A4 in which the gate driver GD is not disposed. That is, the fourth area A4 refers to a partial area of the plurality of third substrates 123 excluding the third area A3.

Figure 5A:
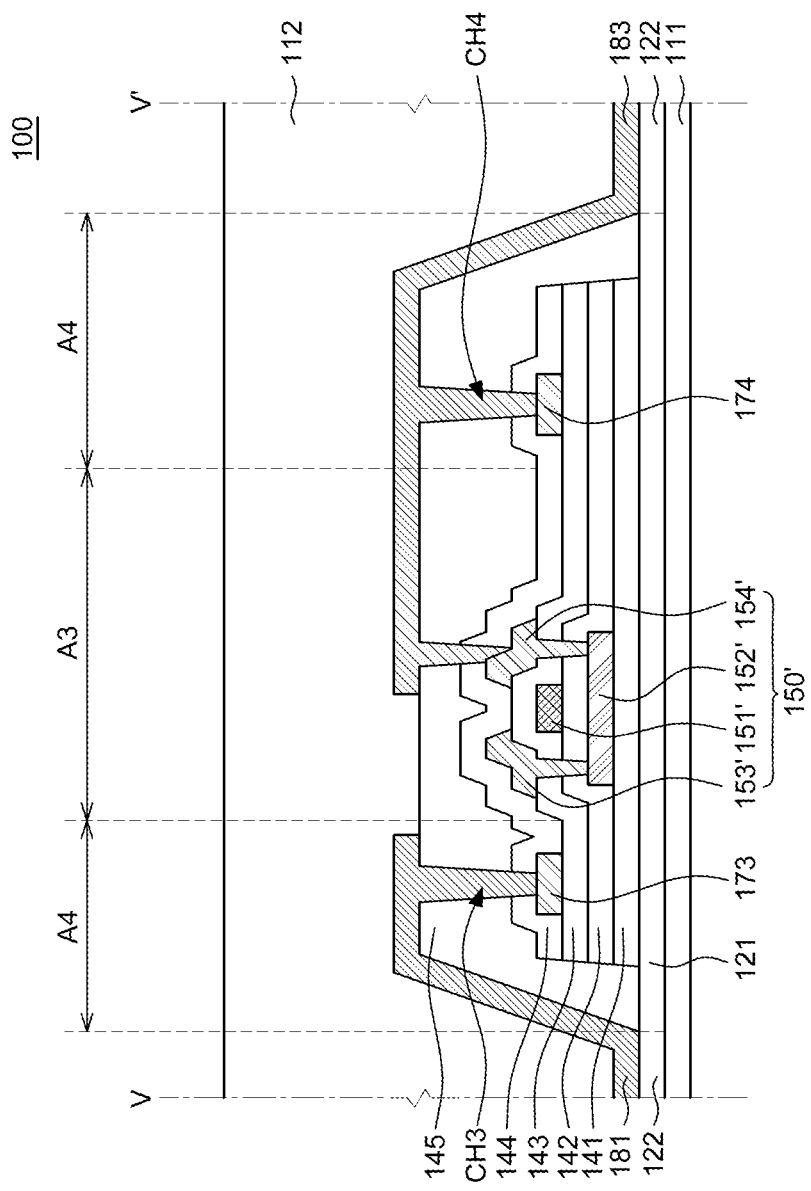
FIGS. 5A and 5B are schematic cross-sectional views taken along V-V' of FIG. 4.
Figure 5B:
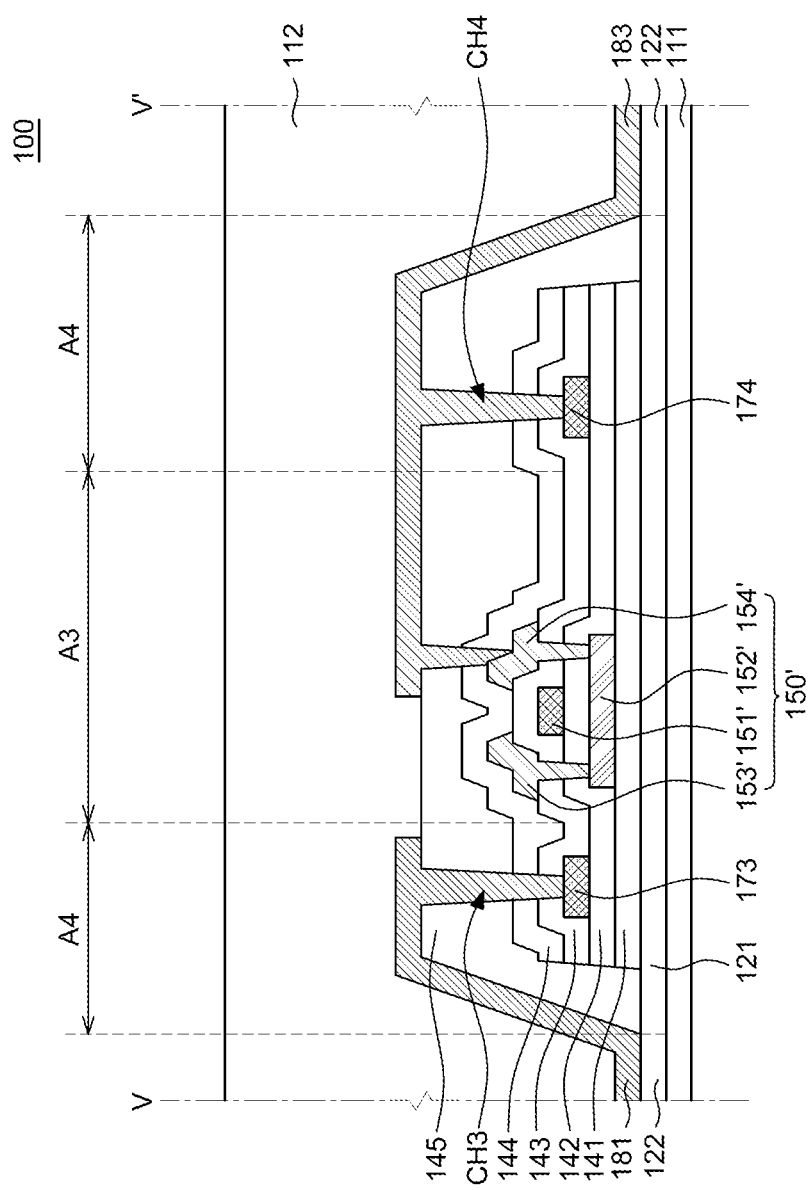

Referring to FIGS. 4, 5A, and 5B, in the third area A3, the gate driver GD which outputs the gate voltage to the plurality of pixels PX is disposed. Further, the gate driver GD may include a transistor 150' which outputs the gate voltage.

In some embodiments, the connection line 180 includes a first connection line 181 and a third connection line 183. In some embodiments, the contact hole CH includes a third contact hole CH3 and a fourth contact hole CH4. In some embodiments, the contact pad 170 includes a third contact pad 173 and a fourth contact pad 174. In the fourth area A4, at least one contact pad 170 is disposed and each of at least one contact pad 170 may be connected to the connection line 180 via at least one contact hole CH. That is, in the fourth area A4, the third contact pad 173 is in physical contact with the first connection line 181 via a third contact hole CH3 to be electrically connected and the fourth contact pad 174 is in physical contact with the third connection line 183 via a fourth contact hole CH4 to be electrically connected.

Specifically, as illustrated in FIG. 4, on the X-Y plane, each of at least one contact hole CH may have a point shape or a polygonal shape and each of at least one contact pad 170 may have a point shape or a polygonal shape depending on a shape of the contact hole CH. The above-described shape of the contact hole CH may be described that a length of the cross-section in an X-axis direction and a length of the cross-section in a Y-axis direction are equal to each other on the X-Y plane.

Hereinafter, referring to FIGS. 5A and 5B, a cross-sectional structure of the non-active area NA will be described in detail. For reference, in the cross-sectional structure of the non-active area NA, a structure and a material of the transistor 150' and a structure and a material of the plurality of inorganic insulating layers are the same as a structure and a material of the transistor 150' and a structure and a material of the plurality of inorganic insulating layers in the active area AA illustrated in FIGS. 3A and 3B. Therefore, repeated description with the cross-sectional structure of the active area AA will be omitted.

Referring to FIGS. 5A and 5B, a plurality of inorganic insulating layers is disposed on the plurality of third substrates 123. For example, the plurality of inorganic insulating layers may include a buffer layer 141, a gate insulating layer 142, an interlayer insulating layer 143, and a passivation layer 144, but is not limited thereto. Therefore, various inorganic insulating layers may be additionally disposed on the plurality of first substrates 121 or one or more of the buffer layer 141, the gate insulating layer 142, the interlayer insulating layer 143, and the passivation layer 144 may be omitted.

Specifically, the buffer layer 141 is disposed on the plurality of third substrates 123. The buffer layer 141 is formed on the plurality of third substrates 123 to protect various components of the stretchable display device 100 from permeation of moisture ($H_2O$) and oxygen ($O_2$) from the outside of the lower substrate 111 and the plurality of third substrates 123.

Referring to FIGS. 5A and 5B, the transistor 150' including a gate electrode 151', an active layer 152', a source electrode 153', and a drain electrode 154' is formed on the buffer layer 141 in the third area A3.

First, referring to FIGS. 5A and 5B, the active layer 152' is disposed on the buffer layer 141. The gate insulating layer 142 is disposed on the active layer 152'. The gate electrode 151' is disposed on the buffer layer 141. The gate electrode 151' is disposed to overlap the active layer 152'. The interlayer insulating layer 143 is disposed on the gate electrode 151'. The source electrode 153' and the drain electrode 154' which are in contact with the active layer 152' are disposed on the interlayer insulating layer 143. The source electrode 153' and the drain electrode 154' are disposed on the same layer to be spaced apart from each other. The source electrode 153' and the drain electrode 154' may be in contact with the active layer 152' to be electrically connected to the active layer 152'.

In the meantime, a plurality of contact pads 170 is disposed in the fourth area A4. The plurality of contact pads 170 disposed in the fourth area A4 may include a third contact pad 173 formed in the Y-axis direction and a fourth contact pad 174 formed in an X-axis direction. As described above, when the plurality of contact pads 170 has a point shape or a polygonal shape, the third contact pad 173 is disposed in the Y-axis direction and the fourth contact pad 174 may be disposed in the X-axis direction.

Further, as illustrated in FIG. 5A, the plurality of contact pads 170 may be formed of the same material as the source electrode 153' and the drain electrode 154'. Alternatively, as illustrated in FIG. 5B, the plurality of contact pads 170 may be formed of the same material as the gate electrode 151'. However, the plurality of contact pads 170 is not limited to the components of the transistor 150, but may be configured by various metals.

Further, in the second area, an output pad and a stage pad may be disposed on the interlayer insulating layer 143. The output pad is a pad which transmits a gate voltage generated in the gate driver GD to the plurality of first connection lines 181. The gate voltage is transmitted to the first connection line 181 from the output pad to be finally transmitted to the plurality of sub pixels SPX via the gate pad. The stage pad is a pad for electrically connecting the plurality of stages of the gate driver GD. A gate voltage output from any one stage is transmitted to the third connection line 183 from the stage pad to be transmitted to the other stage. The output pad and the stage pad may be formed of the same material as the source electrode 153 and the drain electrode 154, but is not limited thereto.

Referring to FIGS. 5A and 5B, the passivation layer 144 is formed on the transistor 150' and the plurality of contact pads 170. That is, the passivation layer 144 covers the transistor 150' to protect the transistor 150' from the permeation of moisture and oxygen.

The planarization layer 145 is formed on the passivation layer 144. The planarization layer 145 planarizes an upper portion of the transistor 150. The planarization layer 145 may be configured by a single layer or a plurality of layers and may be formed of an organic material.

Referring to FIGS. 5A and 5B, the planarization layer 145 is disposed on the plurality of third substrates 123 to cover top surfaces and side surfaces of the buffer layer 141, the gate insulating layer 142, the interlayer insulating layer 143, and the passivation layer 144. The planarization layer 145 may be disposed to enclose the buffer layer 141, the gate insulating layer 142, the interlayer insulating layer 143, and the passivation layer 144 together with the plurality of third substrates 123. Specifically, the planarization layer 145 may be disposed so as to cover a top surface and a side surface of the passivation layer 144, a side surface of the interlayer insulating layer 143, a side surface of the gate insulating layer 142, a side surface of the buffer layer 141, and a part of a top surface of the plurality of third substrates 123. Therefore, the planarization layer 145 may compensate for a step on the side surfaces of the buffer layer 141, the gate insulating layer 142, the interlayer insulating layer 143, and the passivation layer 144 and enhance an adhesive strength of the planarization layer 145 and the connection line 180 disposed on the side surface of the planarization layer 145.

Referring to FIGS. 4, 5A, and 5B, the connection line 180 refers to a wiring line which electrically connects a pad on the first substrate 121 and a pad on the third substrate 123 or electrically connects the pads on the plurality of third substrates 123. The connection line 180 is disposed on the plurality of second substrates 122. Further, the connection line 180 may be electrically connected to the pad on the first substrate 121 or electrically connected to the pad on the third substrate 123 or also be partially formed on the plurality of third substrates 123 to be electrically connected to the pad on the third substrate 123. The above-described pads on the third substrate 123 refer to a plurality of contact pads 170, an output pad, and a stage pad.

The connection line 180 not only includes a first connection line 181 and a second connection line 182, but also may further include a third connection line 183 as illustrated in FIG. 4. The first connection line 181 is disposed between the first substrate 121 and the third substrate 123, and the third connection line 183 is disposed between the plurality of third substrates 123. Specifically, the first connection line 181 refers to a wiring line extending in the X-axis direction between the first substrate 121 and the third substrate 123, among the connection lines 180. The third connection line 183 refers to a wiring line extending in the Y-axis direction between the plurality of third substrates 123, among the connection lines 180.

The connection line 180 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

To be more specific, referring to FIGS. 4, 5A, and 5B, the first connection line 181 may connect a pad on the first substrate 121 and a pad on the third substrate 123 which are disposed to be adjacent in the X-axis direction. The first connection line 181 may serve as a gate line, an emission signal line, a high potential power line, or a low potential power line, but is not limited thereto. For example, the first connection line 181 may serve as a gate line and electrically connect the gate pad on the first substrate 121 and the output pad of the third substrate 123 which are disposed side by side in the X-axis direction. Therefore, as described above, the gate pad on the first substrate 121 and the output pad of the third substrate 123 disposed in the X-axis direction may be connected by the first connection line 181 serving as a gate line and transmit one gate voltage.

Further, the third connection line 183 may connect pads on two third substrates 123 which are disposed side by side among the pads on the plurality of third substrates 123 which is disposed to be adjacent to each other in the Y-axis direction. The third connection line 183 may serve as a gate driving voltage line or a gate clock voltage line, but is not limited thereto. For example, the third connection line 183 serves as the gate driving voltage line and the gate clock voltage line and electrically connects the gate driving voltage line and the gate clock voltage line on two third substrates 123 which are disposed side by side in the Y-axis direction. Therefore, as described above, the pads on the plurality of third substrates 123 disposed in the Y-axis direction may be connected by the plurality of third connection lines 183 serving as a gate driving voltage line and a gate clock voltage line and transmit a gate driving voltage and a gate clock voltage.

As illustrated in FIGS. 5A and 5B, the first connection line 181 may be formed to extend to a top surface of the second substrate 122 while being in contact with a top surface and a side surface of the planarization layer 145 disposed on the third substrate 123. Further, the third connection line 183 may be formed to extend to a top surface of the second substrate 122 while being in contact with a top surface and a side surface of the planarization layer 145 disposed on the third substrate 123. Further, the upper substrate 112 is disposed on the first connection line 181, the third connection line 183, and the lower substrate 111.

Cross-Sectional Structure of Contact Hole

Figure 6A:
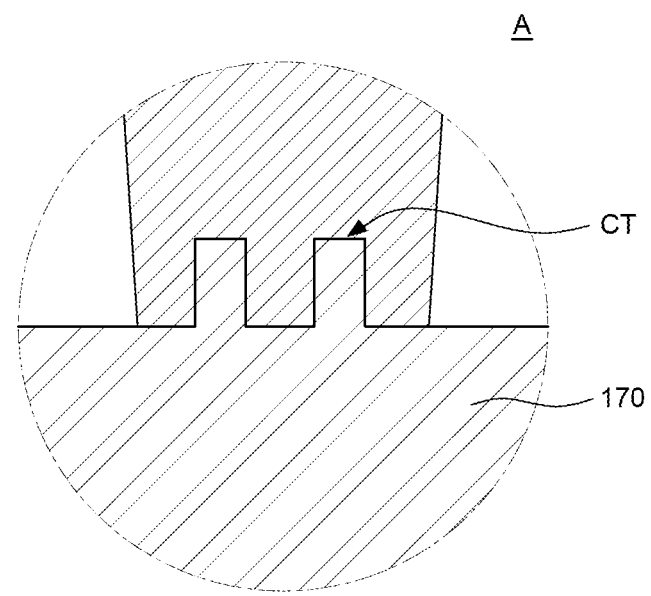
FIG. 6A is an enlarged plan view of a region A of FIG. 3A.
Figure 6B:
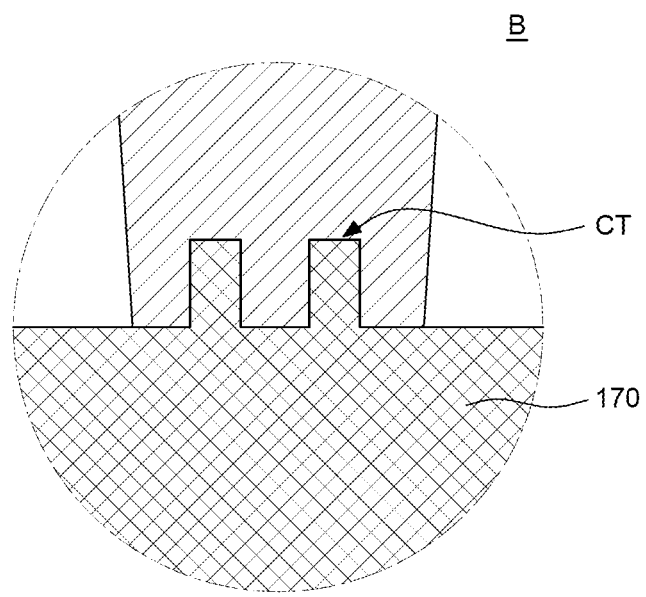
FIG. 6B is an enlarged plan view of a region B of FIG. 3B.

FIG. 6A is an enlarged plan view of a region A of FIG. 3A. FIG. 6B is an enlarged plan view of a region B of FIG. 3B. For the convenience of description, the description will be made also with reference to FIGS. 3A and 3B.

As illustrated in FIGS. 3A and 6A, in the second area A2, at least one contact pad 170 is disposed and each of at least one contact pad 170 may be connected to the connection line via at least one contact hole CH. Similarly, as illustrated in FIG. 5A, also in the fourth area A4, at least one contact pad 170 is disposed and each of at least one contact pad 170 may be connected to the connection line via at least one contact hole CH. Further, the plurality of contact pads 170 may be formed of the same material as the source electrode 153 and the drain electrode 154.

In contrast, as illustrated in FIGS. 3B and 6B, in the second area A2, at least one contact pad 170 is disposed and each of at least one contact pad 170 may be connected to the connection line via at least one contact hole CH. Similarly, as illustrated in FIG. 5B, also in the fourth area A4, at least one contact pad 170 is disposed and each of at least one contact pad 170 may be connected to the connection line via at least one contact hole CH. Further, the plurality of contact pads 170 may be formed of the same material as the gate electrode 151.

Upper surfaces of the plurality of contact pads 170 described above may have an irregular shape. That is, in each contact hole CH, a cross-section of an area of the connection line which is in contact with the contact pad 170 may have an irregular shape or a zigzag shape having curves, rather than a simple straight line.

Therefore, a size of the contact area of the contact pad 170 and the connection line may be increased. Accordingly, since the contact area of the contact pad 170 and the connection line is increased, adhesiveness of the contact pad 170 and the connection line may be further increased.

In the stretchable display device of the related art, a partial area of the connection line is in physically contact only with the gate pad, the data pad, the output pad, and the stage pad and the most area of the connection line is in physically contact with the planarization layer which is an organic material. Further, since the connection line is configured by a metal material such as copper, the adhesiveness between the connection line and the planarization layer formed of an organic material is relatively low and the adhesiveness between the connection line and the pad formed of the metal material is relatively high. Therefore, when the stretchable display device is repeatedly stretched, the compression and extension are repeated in accordance with a Poisson's ratio so that a gap between the connection line and the portion where the planarization layer formed of an organic material is disposed is increased and finally, the connection line is torn.

However, in the stretchable display device according to the embodiment of the present disclosure, a plurality of adhesive pads configured by metal is formed in the second area and the fourth area in which the display element and the transistor are not disposed on the rigid substrate. Further, connection line and the adhesive pad may be configured to directly contact with each other via the contact hole. Therefore, the contact area of the connection line and the pad which is a metal material is relatively increased so that the adhesiveness of the connection line may be enhanced. Accordingly, even though the stretchable display device is repeatedly stretched, the connection line is not torn out. That is, a structural stretching reliability of the stretchable display device is improved.

Further, in the stretchable display device according to the embodiment of the present disclosure, a plurality of adhesive pads which is configured by metal is formed to increase the number of metal pads which is electrically connected to the connection line. Therefore, not only the resistance of the connection line of the stretchable display device is reduced, but also a stability of the voltage to be applied to the connection line may be achieved.

Hereinafter, a stretchable display device according to another embodiment of the present disclosure will be described in detail. As compared with the display device according to the embodiment of the present disclosure, in a stretchable display device according to another embodiment of the present disclosure, only a shape of a contact hole and a shape of a contact pad are different, but the other components are the same. Therefore, a repeated description of the stretchable display device according to another embodiment of the present disclosure and the display device according to one embodiment of the present disclosure will be omitted.

Another Embodiment of Present Disclosure—Trench Type Contact Hole

Figure 7:
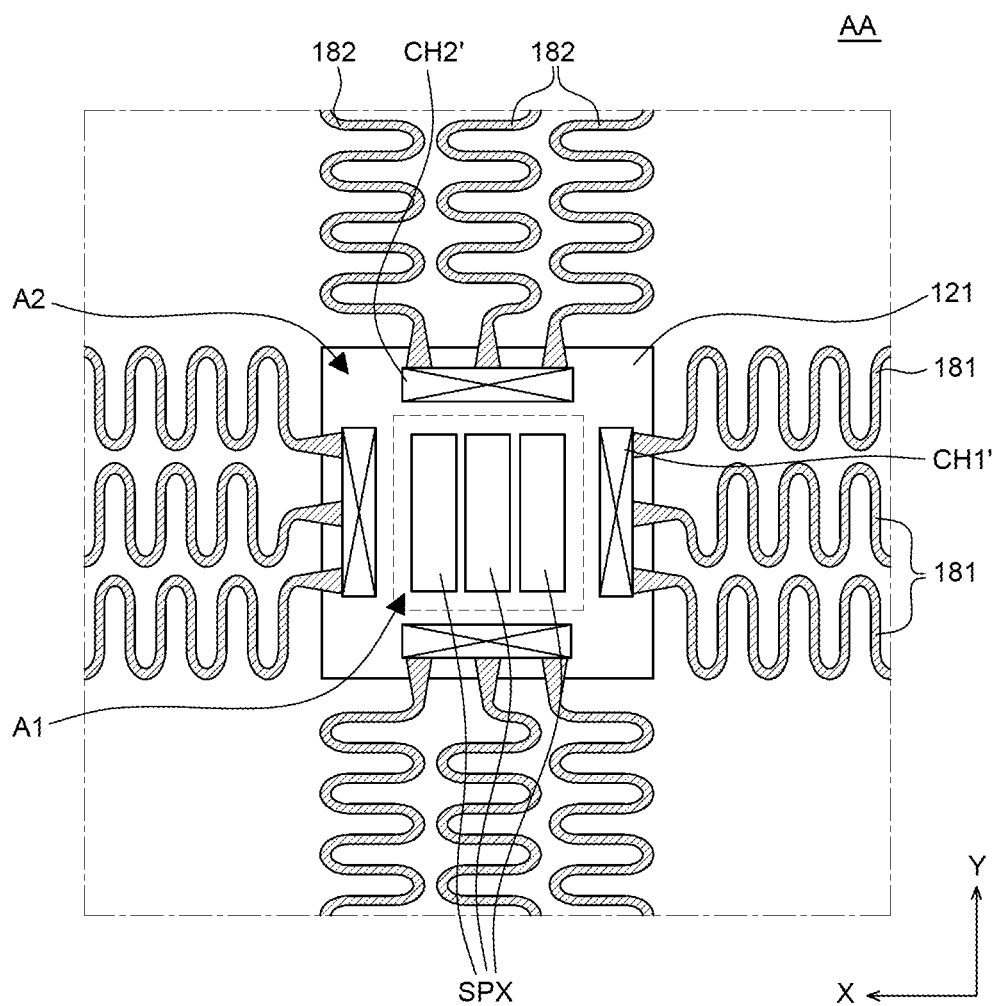
FIG. 7 is an enlarged plan view of an active area of a stretchable display device according to another embodiment of the present disclosure.
Figure 8:
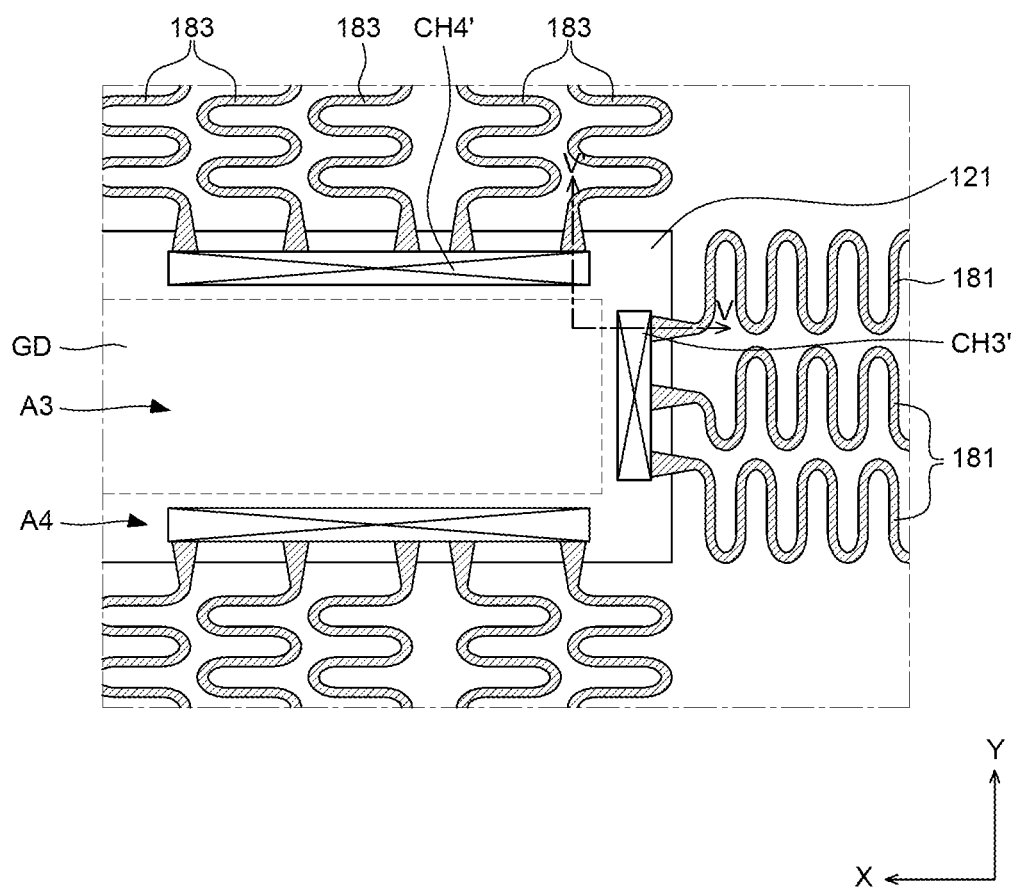
FIG. 8 is an enlarged plan view of a non-active area of a stretchable display device according to another embodiment of the present disclosure.

FIG. 7 is an enlarged plan view of an active area of a stretchable display device according to another embodiment of the present disclosure. FIG. 8 is an enlarged plan view of a non-active area of a stretchable display device according to another embodiment of the present disclosure.

As illustrated in FIG. 7, at least one contact hole CH' may be a trench type with respect to an X-Y plane in the second area A2 and each of at least one contact pad may be a trench type formed in accordance with the shape of the contact hole CH'. The above-described shape of the contact hole CH' may be described that a length of the cross-section in an X-axis direction and a length of the cross-section in a Y-axis direction are different from each other on the X-Y plane. In some embodiments, the contact hole CH' includes a first contact hole CH1' and a second contact hole CH2'. To be more specific, on the X-Y plane, the first contact hole CH1' may have a rectangular shape extending in the Y-axis direction and the second contact hole CH2' may have a rectangular shape extending in the X-axis direction. Therefore, the first contact pad corresponding to the first contact hole CH1' may have a rectangular shape extending in the Y-axis direction and the second contact pad corresponding to the second contact hole CH2' may have a rectangular shape extending in the X-axis direction.

In some embodiments, the contact hole CH' includes a third contact hole CH3' and a fourth contact hole CH4'. In the fourth area A4, with respect to the X-Y plane, at least one contact hole CH' may be a trench type and each of at least one contact pad may be a trench type formed in accordance with the shape of the contact hole CH'. The above-described shape of the contact hole CH' may be described that a length of the cross-section in an X-axis direction and a length of the cross-section in a Y-axis direction are different from each other on the X-Y plane. To be more specific, on the X-Y plane, the third contact hole CH3' may have a rectangular shape extending in the Y-axis direction and the fourth contact hole CH4' may have a rectangular shape extending in the X-axis direction. Therefore, the third contact pad corresponding to the third contact hole CH3' may have a rectangular shape extending in the Y-axis direction and the fourth contact pad corresponding to the fourth contact hole CH4' may have a rectangular shape extending in the X-axis direction.

In the stretchable display device according to another embodiment of the present disclosure, unlike the stretchable display device according to the embodiment of the present disclosure, the contact hole is changed into a trench and thus, a shape of the contact pad may be changed to a polygonal shape having a side with a long length. Accordingly, a volume of the metal material of the contact pad which is electrically connected to the connection line is increased not only to reduce the resistance of the connection line, but also to promote the stability of the voltage applied to the connection line.

Hereinafter, a stretchable display device 900 according to still another embodiment of the present disclosure will be described in detail. As compared with the display device according to the embodiment 100 of the present disclosure, only a first adhesive layer 901 and a second adhesive layer 902 of the stretchable display device 900 according to another embodiment of the present disclosure are different, but the other configurations are the same. Therefore, a repeated description of the stretchable display device 900 according to still another embodiment of the present disclosure and the display device 100 according to one embodiment of the present disclosure will be omitted.

Figure 9A:
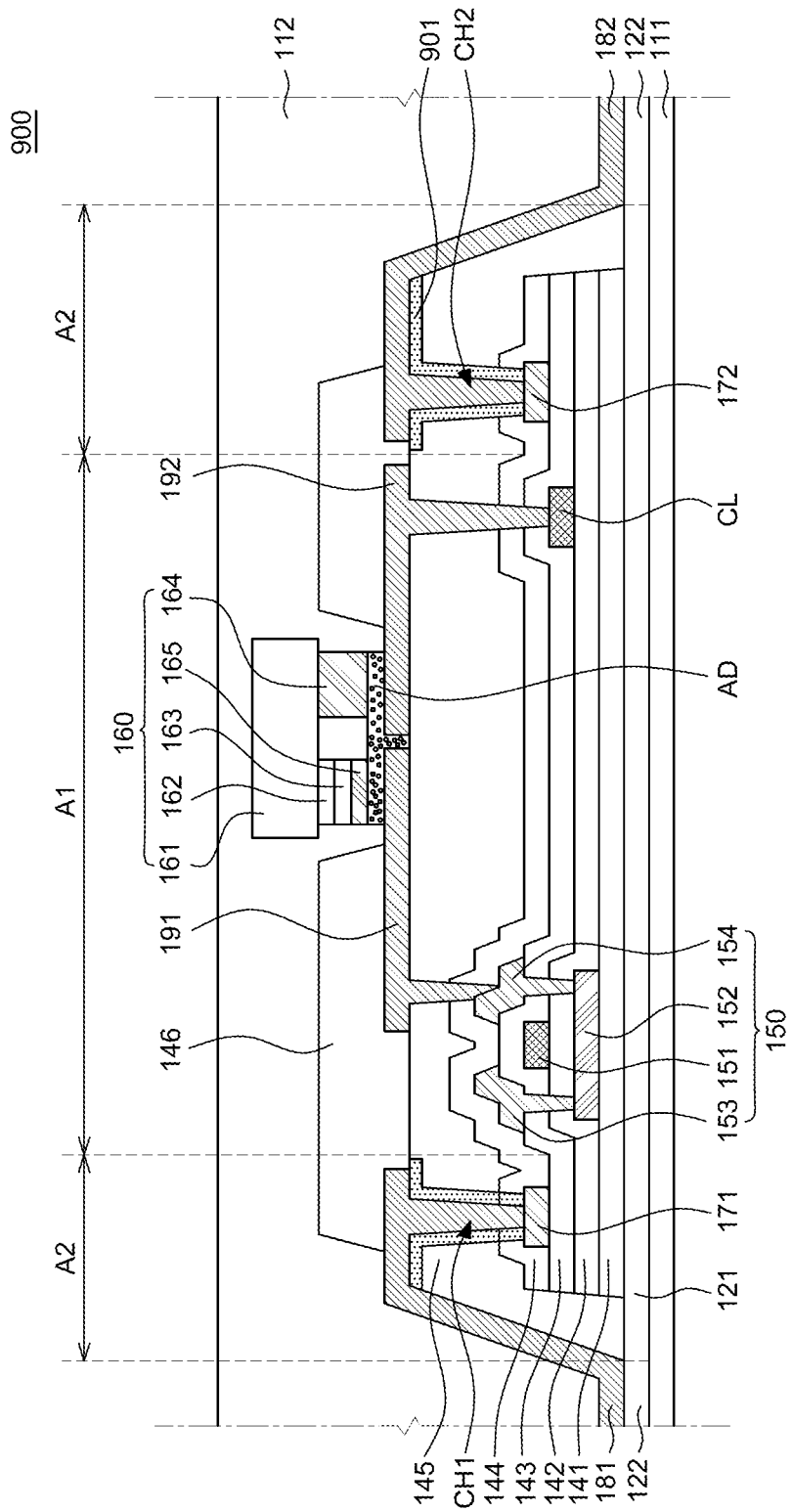
FIGS. 9A and 9B are cross-sectional views of an active area of a stretchable display device according to still another embodiment of the present disclosure.
Figure 9B:
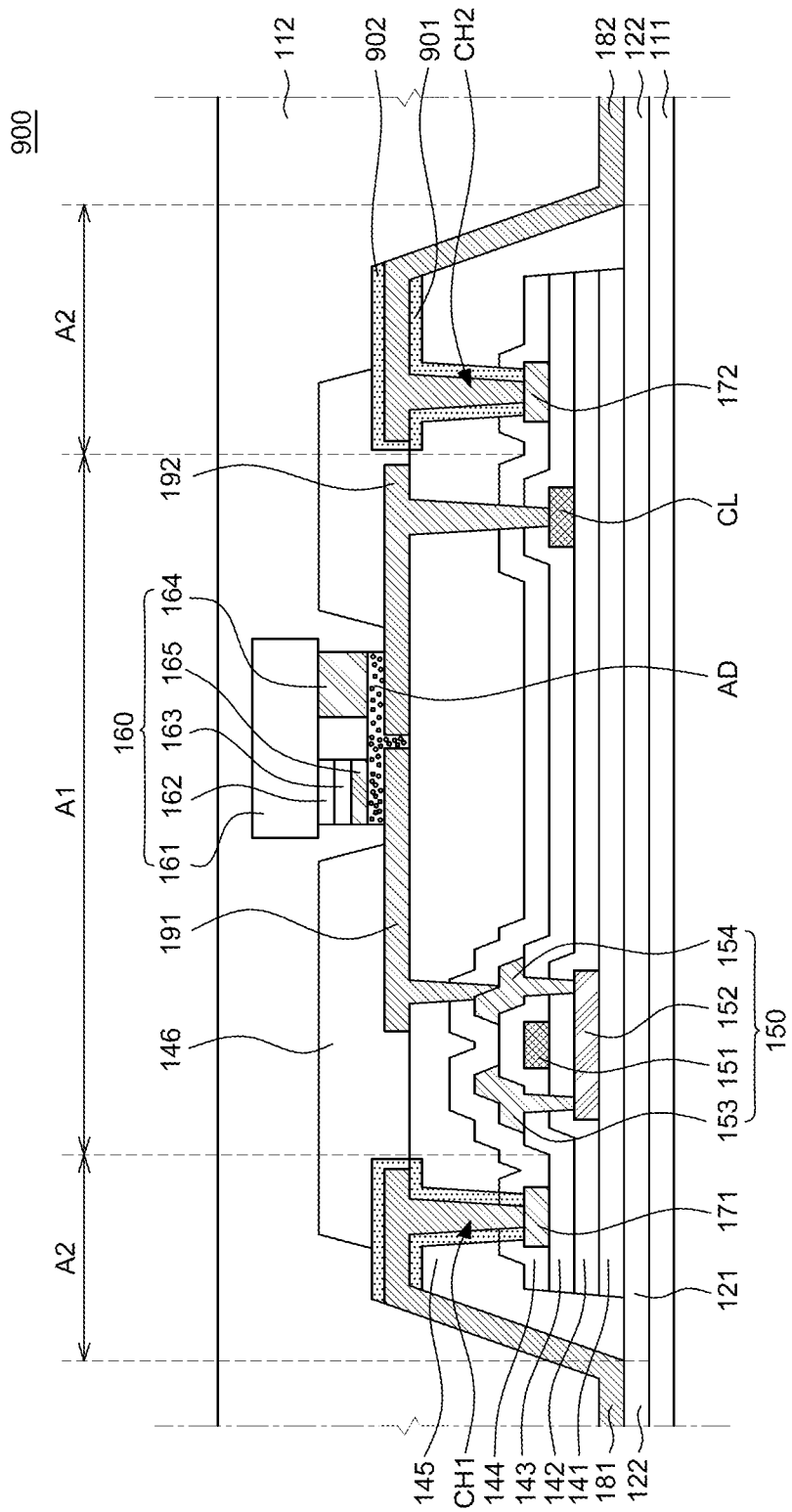

Still Another Embodiment of Present Disclosure, First Adhesive Layer and Second Adhesive Layer FIGS. 9A and 9B are cross-sectional views of an active area of a stretchable display device according to still another embodiment of the present disclosure.

As illustrated in FIG. 9A, in the second area A2, at least one adhesive layer 901 may be disposed between the planarization layer 145 and the connection line 180. That is, the first adhesive layer 901 may be disposed on a bottom surface of the connection line 180 and an inner surface of the contact hole CH. Further, even though not illustrated in FIG. 9A, the first adhesive layer 901 may be disposed not only on the top surface of the planarization layer 145, but also on a side surface of the planarization layer 145.

Alternatively, as illustrated in FIG. 9B, in the second area A2, not only at least one first adhesive layer 901 may be disposed between the planarization layer 145 and the connection line 180, but also at least one second adhesive layer 902 may be disposed between the bank 146 and the connection line 180 and between the upper substrate 112 and the connection line 180. That is, the first adhesive layer 901 may be disposed not only on the bottom surface of the connection line 180 and an inner surface of the contact hole CH, and the second adhesive layer 902 may be disposed on a top surface of the connection line 180. Further, even though not illustrated in FIG. 9B, the first adhesive layer 901 may be disposed not only on the top surface of the connection line 180, but also on a side surface of the connection line 180.

As described above, in FIGS. 9A and 9B, in the second area A2, the first adhesive layer 901 and the second adhesive layer 902 are disposed, however, it is not limited thereto and the first adhesive layer 901 and the second adhesive layer 902 may also be disposed in the fourth area A4.

Further, the first adhesive layer 901 and the second adhesive layer 902 may be configured by a conductive oxide such as indium tin oxide (ITO), indium zinc oxide (IZO), indium gallium oxide (IGO), or indium gallium zinc oxide (IGZO) or may be configured by an inorganic material such as SiNx.

Unlike the stretchable display device according to the embodiment of the present disclosure, in the stretchable display device according to still another embodiment of the present disclosure, an adhesive layer is formed in an area between the component configured by an organic material and the connection line. Accordingly, the adhesive layer which is configured by the conductive oxide or the inorganic material may serve as a buffer between a connection line which has a different physical property and a component configured by an organic material. Accordingly, since the adhesiveness of the connection line is enhanced, even though the stretchable display device is repeatedly stretched, the connection line is not torn out. As a result, a structural stretching reliability of the stretchable display device is improved.

The embodiments of the present disclosure can also be described as follows:

In order to achieve the above-described benefits, according to some embodiments of the present disclosure, a stretchable display device includes a lower substrate; a plurality of first substrates which is disposed on the lower substrate and includes a first area in which a plurality of sub pixel including a display element and a driving element is disposed and a second area excluding the first area; a plurality of second substrates configured to connect adjacent first substrates among the plurality of first substrates; and a plurality of connection lines which are disposed on the plurality of second substrates and are configured to connect the plurality of sub pixels, and in the second area, a first contact pad and a second contact pad are disposed and the first contact pad and the second contact pad are connected to the plurality of connection lines via a plurality of contact holes. By doing this, a structural reliability of the stretchable display device may be improved.

The stretchable display device may further include a plurality of third substrates which is disposed on the lower substrate and includes a third area in which a gate driver is disposed and a fourth area excluding the third area.

The plurality of connection lines may connect a plurality of stages of the gate driver, in the fourth area, a third contact pad and a fourth contact pad may be disposed, and the third contact pad and the fourth contact pad may be connected to the plurality of connection lines via a plurality of contact holes.

The first contact pad, the second contact pad, the third contact pad, and the fourth contact pad may be disposed on the same layer as a gate electrode of the driving element.

The first contact pad, the second contact pad, the third contact pad, and the fourth contact pad may be disposed on the same layer as a source electrode and a drain electrode of the driving element.

The first contact pad and the second contact pad may be disposed to be perpendicular to each other and the third contact pad and the fourth contact pad are disposed to be perpendicular to each other.

The plurality of contact holes has a point shape or a polygonal shape.

The plurality of contact holes has a trench shape.

The stretchable display device may further comprise a first adhesive layer disposed on inner surfaces of the plurality of contact holes and on bottom surfaces of the plurality of connection lines.

The first adhesive layer may be configured by any one of ITO, IZO, IGO, IGZO, and SiNx.

The stretchable display device may further comprises a second adhesive layer disposed on top surfaces and side surfaces of the plurality of connection lines.

The second adhesive layer may be configured by any one of ITO, IZO, IGO, IGZO, and SiNx.

According to another aspect of the present disclosure, a stretchable display device includes a ductile substrate; a plurality of rigid substrates which is disposed on the ductile substrate and includes an emission area in which light is emitted from a display element and a non-emission area in which light is not emitted; a plurality of connection lines disposed between the plurality of rigid substrates; and a plurality of contact pads which is disposed in the non-emission area and is configured to directly contact only with the plurality of connection lines. By doing this, the separation of the plurality of connection lines may be reduced or minimized.

The plurality of contact pads may be formed of the same material as a gate electrode of a transistor which drives the display element.

The plurality of contact pads may be formed of the same material as a source electrode and a drain electrode of a transistor which drives the display element.

The stretchable display device may further comprise an adhesive layer disposed in at least a part of an outer surface of the plurality of connection lines.

The adhesive layer may be configured by a conductive oxide or an inorganic material.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
   a lower substrate;
   a plurality of first substrates which is disposed on the lower substrate and includes a first area in which a plurality of sub pixel including a display element and a driving element is disposed and a second area excluding the first area;
   a plurality of second substrates configured to couple adjacent first substrates among the plurality of first substrates; and
   a plurality of connection lines which are disposed on the plurality of second substrates and are configured to couple the plurality of sub pixels,
   wherein in the second area, a first contact pad and a second contact pad are disposed, and
   wherein the first contact pad and the second contact pad are coupled to the plurality of connection lines via a plurality of contact holes.

2. The stretchable display device according to claim 1, further comprising:
   a plurality of third substrates which is disposed on the lower substrate and includes a third area in which a gate driver is disposed and a fourth area excluding the third area,
   wherein the plurality of connection lines are configured to couple a plurality of stages of the gate driver,
   wherein a third contact pad and a fourth contact pad are disposed in the fourth area, and
   wherein the third contact pad and the fourth contact pad are coupled to the plurality of connection lines via a plurality of contact holes.

3. The stretchable display device according to claim 2, wherein the first contact pad, the second contact pad, the third contact pad, and the fourth contact pad are disposed on a same layer as a gate electrode of the driving element.

4. The stretchable display device according to claim 2, wherein the first contact pad, the second contact pad, the third contact pad, and the fourth contact pad are disposed on a same layer as a source electrode and a drain electrode of the driving element.

5. The stretchable display device according to claim 2, wherein the first contact pad and the second contact pad are disposed to be perpendicular to each other and wherein the third contact pad and the fourth contact pad are disposed to be perpendicular to each other.

6. The stretchable display device according to claim 1, wherein the plurality of contact holes has a point shape or a polygonal shape.

7. The stretchable display device according to claim 1, wherein the plurality of contact holes has a trench shape.

8. The stretchable display device according to claim 1, further comprising:
   a first adhesive layer disposed on inner surfaces of the plurality of contact holes and on bottom surfaces of the plurality of connection lines,
   wherein the first adhesive layer is configured by any one of ITO, IZO, IGO, IGZO, and SiNx.

9. The stretchable display device according to claim 1, further comprising:
- a second adhesive layer disposed on top surfaces and side surfaces of the plurality of connection lines,
- wherein the second adhesive layer is configured by any one of ITO, IZO, IGO, IGZO, and SiNx.

10. A stretchable display device, comprising:
- a ductile substrate;
- a plurality of first substrates which is disposed on the ductile substrate and includes an emission area in which light is emitted from a display element and a non-emission area in which light is not emitted;
- a plurality of second substrates configured to couple adjacent first substrates among the plurality of first substrates;
- a plurality of connection lines disposed between the plurality of first substrates and disposed on the plurality of second substrates, and
- a plurality of contact pads which is disposed in the non-emission area of the plurality of first substrates and is configured to directly contact only with the plurality of connection lines.

11. The stretchable display device according to claim 10, wherein the plurality of contact pads is formed of a same material as a gate electrode of a transistor which drives the display element.

12. The stretchable display device according to claim 10, wherein the plurality of contact pads is formed of a same material as a source electrode and a drain electrode of a transistor which drives the display element.

13. The stretchable display device according to claim 10, wherein the plurality of contact pads has a point shape or a polygonal shape.

14. The stretchable display device according to claim 10, wherein the plurality of contact pads has a trench shape.

15. The stretchable display device according to claim 10, further comprising:
- an adhesive layer disposed in at least a part of an outer surface of the plurality of connection lines,
- wherein the adhesive layer is configured by a conductive oxide or an inorganic material.

\* \* \* \* \*